United States Patent
Lien

(10) Patent No.: US 9,299,421 B1
(45) Date of Patent: Mar. 29, 2016

(54) STATIC RANDOM ACCESS MEMORY AND METHOD THEREOF

(71) Applicant: M31 Technology Corporation, Hsinchu County (TW)

(72) Inventor: Nan-Chun Lien, Taipei (TW)

(73) Assignee: M31 Technology Corporation, Zhubei, Hsinchu County (TW)

( * ) Notice: Subject to any disclaimer, the term of this patent is extended or adjusted under 35 U.S.C. 154(b) by 0 days.

(21) Appl. No.: 14/510,046

(22) Filed: Oct. 8, 2014

(51) Int. Cl.
  *G11C 7/10* (2006.01)
  *G11C 11/419* (2006.01)
  *G11C 7/22* (2006.01)

(52) U.S. Cl.
  CPC ............ *G11C 11/419* (2013.01); *G11C 7/1051* (2013.01); *G11C 7/1078* (2013.01); *G11C 7/22* (2013.01)

(58) Field of Classification Search
  CPC ....... G11C 7/1051; G11C 7/1078; G11C 7/22
  USPC .............................. 365/189.05, 154, 156, 190
  See application file for complete search history.

(56) References Cited

U.S. PATENT DOCUMENTS

| | | | | |
|---|---|---|---|---|
| 5,757,702 A | * | 5/1998 | Iwata ................... | G11C 11/419 365/154 |
| 8,320,164 B2 | | 11/2012 | Chuang et al. | |
| 2009/0016138 A1 | | 1/2009 | Bhatia | |
| 2012/0206988 A1 | * | 8/2012 | Song ...................... | G11C 5/145 365/203 |

OTHER PUBLICATIONS

Kevin Zhang et al., "SRAM Design on 65-nm CMOS Technology with Dynamic Sleep Transistor for Leakage Reduction", IEEE Journal of Solid-State Circuits, vol. 40, No. 4, Apr. 2005, pp. 895-901.
Erik Karl et al., "A 4.6 GHz Mb SRAM Design in 22 nm Tri-Gate CMOS Technology with Integrated Read and Write Assist Circuitry", IEEE Journal of Solid-State Circuits, vol. 48, No. 1, Jan. 2013, pp. 150-158.
Harold Pilo et al., A 64Mb SRAM in 32nm High-k Metal-Gate SOI Technology with 0.7V Operation Enabled by Stability, Write-Ability and Read-Ability Enhancements, 2011 IEEE International Solid-State Circuits Conference, Session 14/High-Performance Embedded Memory/14.1.
Taejoong Song et al., "A 14nm FinFET 128Mb 6T SRAM with Vmin Enhancement Techniques for Low-Power Applications", 2014 IEEE International Solid-State Circuits Conference, Session 13/Advanced Embedded Memory/13.2.

(Continued)

*Primary Examiner* — Jason Lappas
(74) *Attorney, Agent, or Firm* — Donald E. Stout; Stout, Uxa & Buyan, LLP

(57) ABSTRACT

A static random access memory (SRAM) includes a voltage generator coupled to receive a positive power supply voltage, and to controllably generate a first power supply voltage, which is with a reduced level and is higher than a retention voltage during a specific period. A first inverter and a second inverter each is connected between the first power supply voltage and a second power supply voltage. The first inverter and the second inverter are cross-coupled, and the output nodes of the first inverter and the second inverter act as a bit node pair.

18 Claims, 7 Drawing Sheets

(56) References Cited

OTHER PUBLICATIONS

Yen-Huei Chen et al., "A 16nm 128Mb SRAM in High-K Metal-Gate FinFET Technology with Write-Assist Circuitry for Low-Vmin Applications", 2014 IEEE International Solid-State Circuits Conference, Session 13/Advanced Embedded Memory/13.5.

Shinji Tanaka et al., "A 512-kb 1-GHz 28-nm Partially Write-Assisted Dual-Port SRAM with Self-Adjustable Negative Bias Bitline", IEEE, 2014 Symposium on VLSI Circuits Digest of Technical Papers.

\* cited by examiner

STATIC RANDOM ACCESS MEMORY AND METHOD THEREOF

BACKGROUND OF THE INVENTION

1. Field of the Invention

The present invention generally relates to a static random access memory (SRAM), and more particularly to a SRAM having an enhanced write margin with scaled power supply voltage.

2. Description of Related Art

Static random access memory (SRAM) is a type of semiconductor memory device that uses a latch to store a bit of information without a need of periodical refreshing as required in a dynamic random access memory (DRAM). A typical SRAM cell is made up of six transistors (6-T), while more transistors (e.g., 8-T) or fewer transistors (e.g., 4-T) may be available. SRAM cells are ordinarily arranged in an array of rows and columns. A word line is connected to, and is used to select, SRAM cells of the associated row. A pair of bit lines is connected to SRAM cells of the associated column, through which the SRAM cell may be read out or written into a bit of information.

As integrated circuits have been scaled down, a power supply voltage may be reduced as well. In order to increase the read margin of the SRAM cell to prevent read errors due to noise, the power supply voltage should be kept as high as possible. Some schemes are thus proposed to explore a minimum power supply voltage Vmin required for reliable read and write operations at a scaled-down power supply voltage.

Conventional SRAM suffers from half-select disturb phenomenon as a word line may simultaneously turn on the SRAM cells adjacent to the selected one of the same row, causing the adjacent SRAM cells to unwanted discharge. Moreover, as the SRAM cell is selected and read, a read disturb voltage may be undesirably rendered due to voltage divider made of an access transistor and a pull-down transistor.

A word line boosting scheme has been proposed for the conventional SRAM to provide a higher discharge current with a high word line voltage level. The word line boosting scheme, however, suffers from low MOS capacitance value in a low-voltage operation, limited cells number associated with a word line, and half-select disturb.

For the reason that conventional SRAM devices may be liable to errors with scaled power supply voltage, a need has arisen to propose a novel SRAM with maintained or even enhanced read/write margin.

SUMMARY OF THE INVENTION

In view of the foregoing, it is an object of the embodiment of the present invention to provide a SRAM with an enhanced write margin and/or a lower Vmin. In one embodiment, the SRAM provides a negative bit line voltage to improve writability, and furnishes power supply voltage drop to assist in discharging at a bit node.

According to one embodiment, the static random access memory (SRAM) includes a voltage generator, a first inverter and a second inverter. The voltage generator is coupled to receive a positive power supply voltage, and to controllably generate a first power supply voltage, wherein the first power supply voltage is with a reduced level and is higher than a retention voltage during a specific period. The first inverter connected between the first power supply voltage and a second power supply voltage; and the second inverter connected between the first power supply voltage and the second power supply voltage. The first inverter and the second inverter are cross-coupled, and the output nodes of the first inverter and the second inverter act as a bit node pair.

DETAILED DESCRIPTION OF THE INVENTION

Figure 1A:
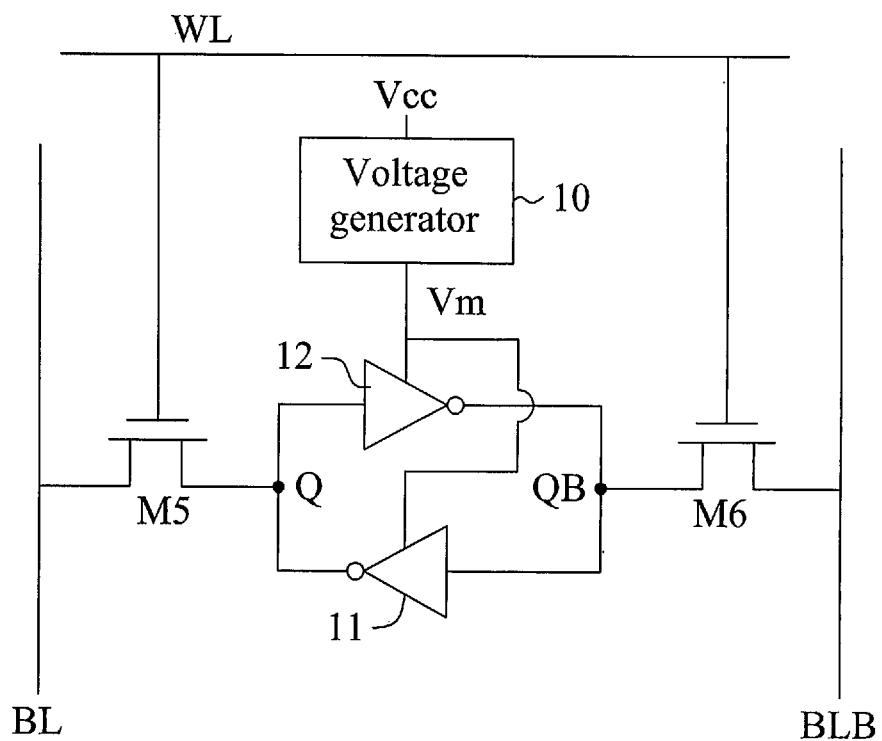
FIG. 1A shows a circuit diagram illustrated of a static random access memory (SRAM) according to one embodiment of the present invention.
Figure 1B:
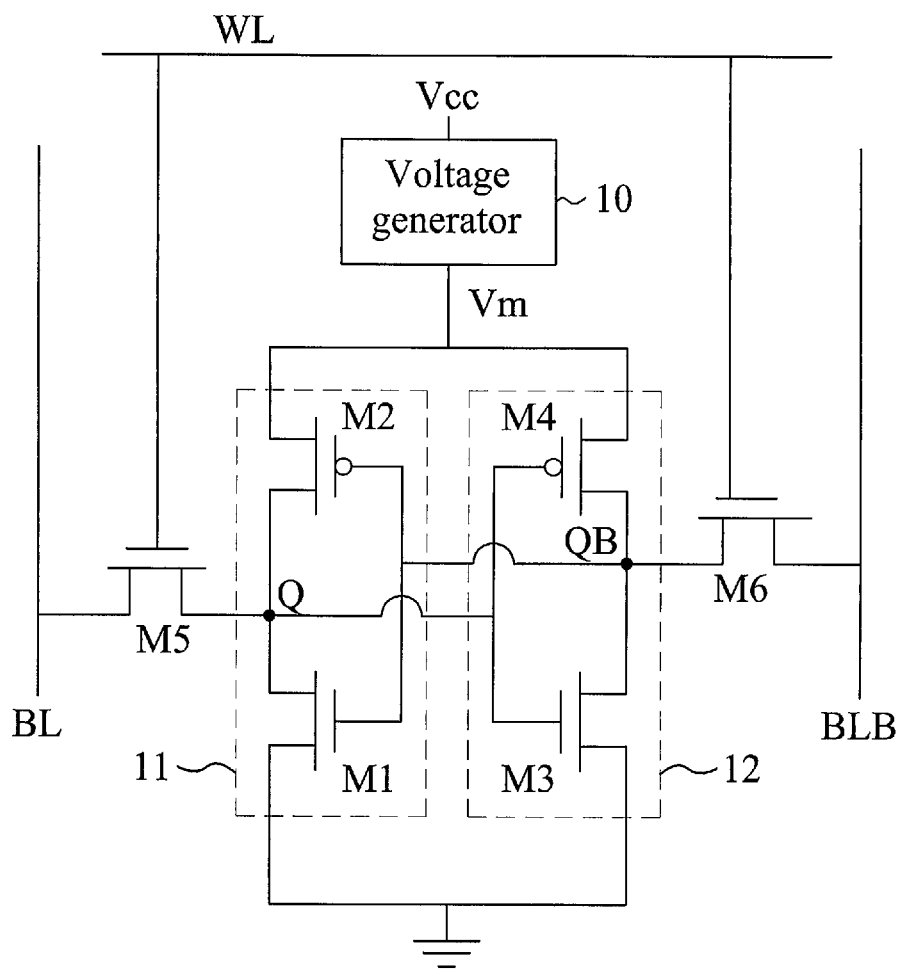
FIG. 1B shows a detailed circuit diagram of the SRAM of FIG. 1A.

FIG. 1A shows a circuit diagram illustrated of a static random access memory (SRAM) 100 according to one embodiment of the present invention, and FIG. 1B shows a detailed circuit diagram of the SRAM 100 of FIG. 1A. One SRAM cell is representatively shown, and a plurality of the same SRAM cells may be arranged in an array of rows and columns to form a SRAM device. Although a 6-T SRAM is illustrated in the following embodiment, it is appreciated that the present invention may be embodied in other SRAM with different number of transistor, or may be embodied in a dual-port SRAM.

The SRAM 100 of the embodiment includes a voltage generator 10 that is coupled to receive a positive power supply voltage Vcc, and is configured to controllably generate a first power supply voltage Vm, wherein the first power supply voltage is with a reduced level and is higher than a retention voltage during a specific period. The positive power supply voltage Vcc of the embodiment may be as low as a minimum power supply voltage Vmin to save power consumption. In the specification, the minimum power supply voltage Vmin is the minimum voltage that makes the SRAM 100 function properly with substantially high yield (e.g. >90%).

The SRAM 100 also includes a first inverter 11 comprised of a pull-down transistor M1 and a pull-up transistor M2. The pull-down transistor M1 (e.g., an N-type metal-oxide-semiconductor transistor or NMOS transistor) and the pull-up transistor M2 (e.g., a P-type metal-oxide-semiconductor transistor or PMOS transistor) are connected in series between the first power supply voltage Vm and a second power supply voltage (e.g., ground). Specifically, gates of the pull-down transistor M1 and the pull-up transistor M2 are connected as an input node of the first inverter 11, and drains of the pull-down transistor M1 and the pull-up transistor M2 are connected as an output node Q of the first inverter 11, which acts as a bit node of the SRAM 100. Sources of the pull-down transistor M1 and the pull-up transistor M2 are connected to the first power supply voltage Vm and the second power supply voltage, respectively.

The SRAM 100 also includes a second inverter 12 comprising a pull-down transistor M3 (e.g., a NMOS transistor) and a pull-up transistor M4 (e.g., a PMOS transistor), which are connected in series between the first power supply voltage Vm and the second power supply voltage in a manner similar to the first inverter 11. Specifically, gates of the pull-down transistor M3 and the pull-up transistor M4 are connected as an input node of the second inverter 12, and drains of the pull-down transistor M3 and the pull-up transistor M4 are connected as an output node QB of the second inverter 12, which acts as an inverted bit node of the SRAM 100. Sources of the pull-down transistor M3 and the pull-up transistor M4 are connected to the first power supply voltage Vm and the second power supply voltage, respectively. Wherein in this embodiment, the second power supply voltage is grounded, but not limited to.

The first inverter 11 and the second inverter 12 are cross-coupled. That is, the input node of the first inverter 11 is connected to the output node QB of the second inverter 12, and the input node of the second inverter 12 is connected to the output node Q of the first inverter 11.

The SRAM 100 further includes a first access transistor M5 (e.g., an NMOS transistor) connected between the output node Q of the first inverter 11 and a bit line BL. Specifically, a drain of the first access transistor M5 is connected to the output node Q of the first inverter 11, a source of the first access transistor M5 is connected to the bit line BL, and a gate of the first access transistor M5 is connected to the word line WL and controlled according to a word line voltage.

The SRAM 100 further includes a second access transistor M6 (e.g., an NMOS transistor) connected between the output node QB of the second inverter 12 and an inverted bit line BLB. Specifically, a drain of the second access transistor M6 is connected to the output node QB of the second inverter 12, a source of the second access transistor M6 is connected to the inverted bit line BLB, and a gate of the second access transistor M6 is connected to the word line WL and controlled according to the word line voltage.

When the word line voltage is active, the voltage generator 10 generates the first power supply voltage with substantially the same voltage as the positive power supply voltage during a first period and generates the first power supply voltage with the reduced level during the specific period.

Figure 2A:
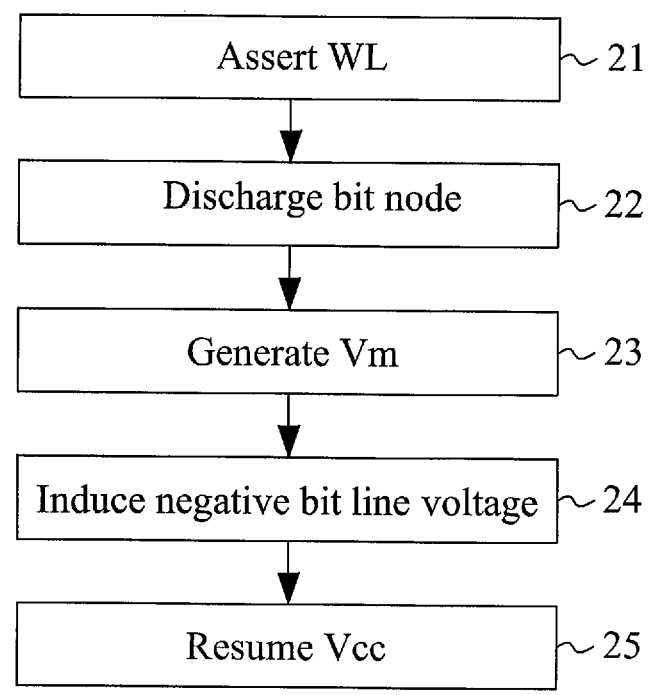
FIG. 2A shows a flow diagram of operating the SRAM of FIG. 1A/1B.
Figure 2B:
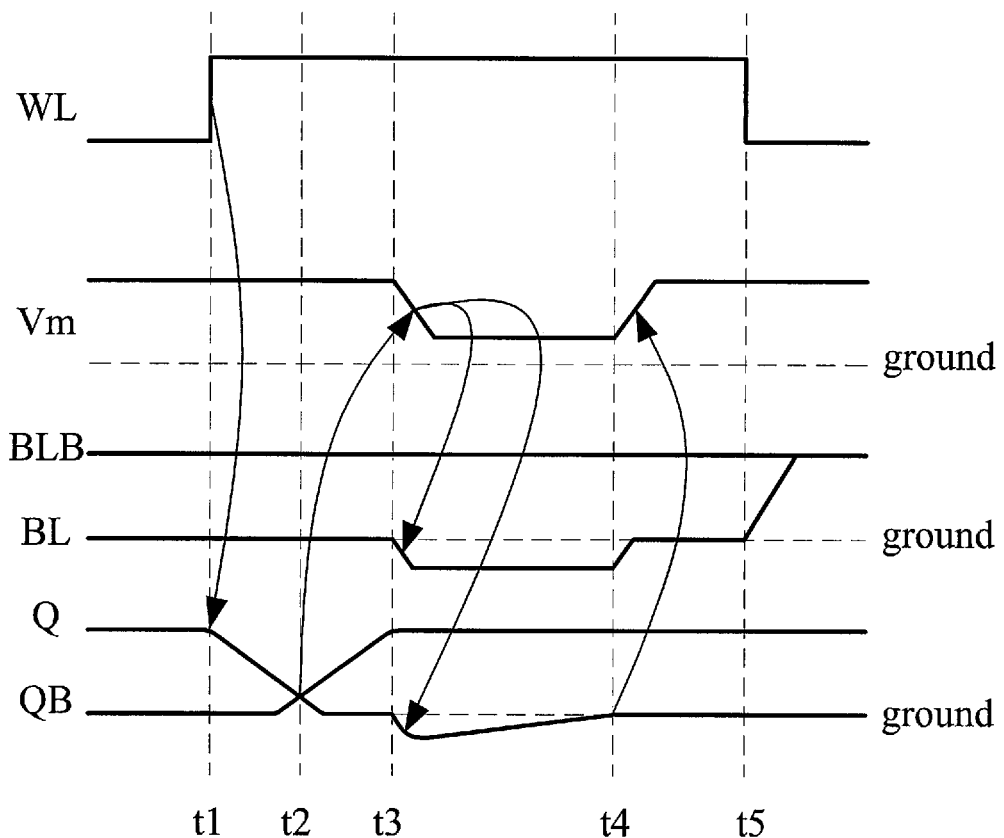
FIG. 2B shows timing diagrams of pertinent signals of FIG. 1A/1B.
Figure 2C:
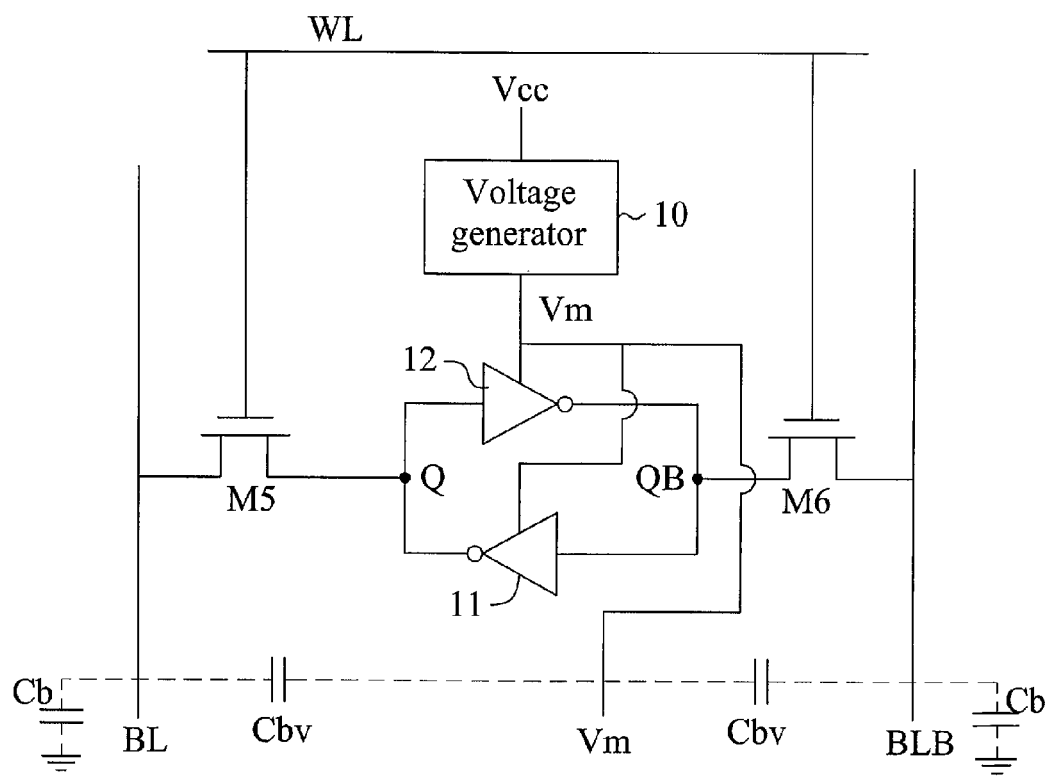
FIG. 2C exemplifies operation of the SRAM of FIG. 1A/1B.

FIG. 2A shows a flow diagram of operating the SRAM 100 of FIG. 1A/1B, FIG. 2B shows timing diagrams of pertinent signals of FIG. 1A/1B, and FIG. 2C exemplifies operation of the SRAM 100 of FIG. 1A/1B.

Assume "1" (logic High) is initially stored at one of the bit node pair (e.g., the bit node Q), and a "0" is written to the SRAM 100 by applying a "0" to one of the bit line pair (e.g., the bit line BL). In step 21, the word line WL is asserted (logical high level) at time t1. Accordingly, the bit node Q discharges through the bit line BL (step 22). On the other hand, the inverted bit node QB charges through the inverted bit line BLB. After the voltage levels of the bit node Q and the inverted bit node QB cross at time t2, the voltage generator 10 generates the first power supply voltage Vm in step 23. As illustrated in FIG. 2B, the first power supply voltage Vm is reduced at time t3 (from the positive power supply voltage Vcc) to a reduced level less than Vcc. Specifically, the reduced level may be as low as a retention voltage that is the lowest voltage required to retain bit information of the SRAM 100 when it is not selected (by the word line WL). The voltage generator 10 may be implemented by conventional techniques for circuitry design, and details thereof are omitted for brevity. In another embodiment, the voltage generator 10 may generate the first power supply voltage with the reduced level after the voltage level of the bit node Q substantially reaches ground.

According to one aspect of the embodiment, as shown in FIG. 2C, a parasitic couple capacitance Cbv between a line of the first power supply voltage Vm and the bit line BL (or the inverted bit line BLB) is utilized in the embodiment to improve writability. Specifically, as the first power supply voltage Vm is reduced at time t3, a negative bit line voltage is then induced on the bit line BL, in step 24, owing to the parasitic couple capacitance Cbv, which helps discharging the bit node Q through the bit line BL. In some embodiments, right after the word line WL is asserted, the inverted bit node QB doesn't charge through the inverted bit line BLB quickly and the voltage level of the inverted bit node QB stays near ground until the voltage generator 10 generates the first power supply voltage Vm and the negative bit line voltage is induced. In other words, the reducing of first power supply voltage Vm and the inducing of the negative bit line voltage help the voltage level of the bit node Q fall and the voltage level of the inverted bit node QB rise and thus the voltage levels of the bit node Q and the inverted bit node QB cross significantly.

As shown in FIG. 2B, as the first power supply voltage Vm is reduced at time t3, the bit node Q becomes negative as well. When the voltage level of the bit node Q finally substantially returns to ground level at time t4, the voltage generator 10 may resume the positive power supply voltage Vcc in step 25 before the word line WL de-asserts (logical low level) at time t5. The operation described above may be well applied when "1" is initially stored at the inverted bit node QB, and a "0" is written to the SRAM 100 by applying a "1" to the inverted bit line BLB.

Figure 3:
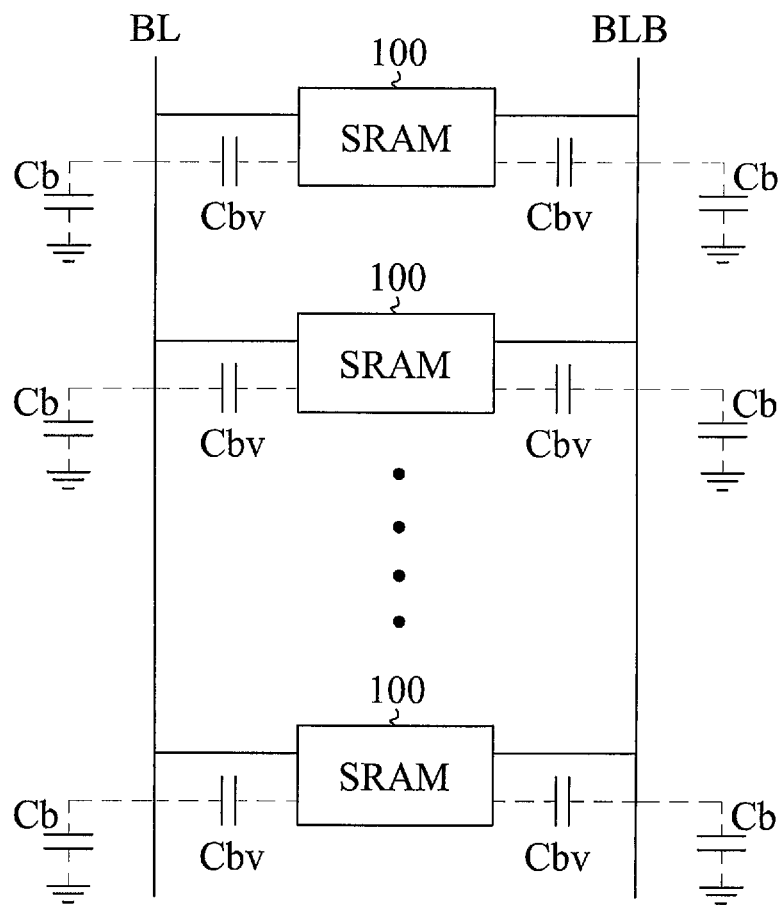
FIG. 3 shows plural SRAM cells coupled between a pair of bit lines.

According to the embodiment described above, the reduced level of the first power supply voltage Vm may assist in discharging the bit node Q by weakening the pull-up transistor M2. Moreover, the negative bit line voltage may help discharging the bit node Q through the bit line BL. It is noted that boosting capacitors (implemented by MOS transistor) coupled to the bit lines as in the conventional SRAM are no longer required in the embodiment, thereby substantially improving efficiency in circuit area usage over the conventional SRAM. Instead, in the embodiment, a boosting ratio defined by Cbv/(Cb+Cbv) may be adaptively maintained constant to provide an enhanced write margin, no matter how many SRAM cells are coupled with an associated pair of bit lines, thereby making high-density SRAM mode feasible. Wherein Cb represents a parasitic bit line capacitance of one line of the bit line pair and Cbv represents the a parasitic couple capacitance between a line of the first power supply voltage and the one line of the bit line pair, and wherein in response to the change of the first power supply voltage from the first period to the specific period, a voltage of the one line of the bit line pair drops according to the boosting ratio; and wherein in response to the change of the first power supply voltage to the reduced level, the negative bit line voltage is induced according to the boosting ratio. FIG. 3 shows plural SRAM cells 100 coupled between a pair of bit lines (i.e., the bit line BL and the inverted bit line BLB). For one cell, the unit parasitic bit line capacitance is Cb while the unit parasitic couple capacitance is Cbv, and for K cells, the total parasitic bit line capacitance is KCb while the total parasitic couple capacitance is KCbv, where K is a positive integer. According to the boosting ratio defined above, KCbv/(KCb+KCbv)=Cbv/(Cb+Cbv), and therefore the boosting ratio may be maintained substantially constant, which is independent of the number of cells with the same BL/BLB or independent of the length of BL/BLB. To the contrary, the boosting capacitors used in the conventional SRAM cannot be adapted to different situations such as different power supply voltage or different bit line length and thus it must accommodate a worst case design.

Figure 4:
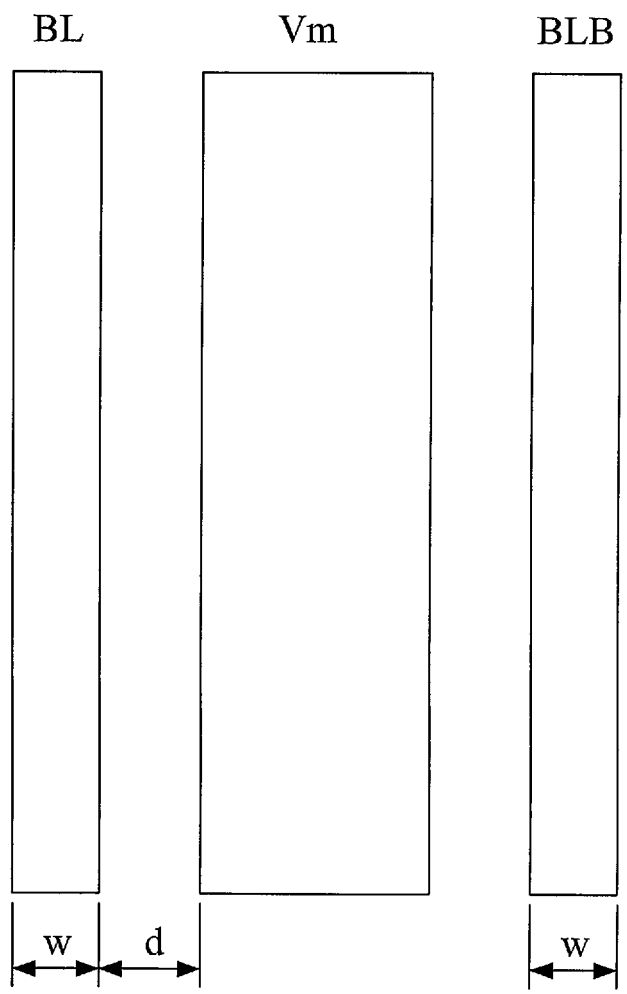
FIG. 4 illustrates a simplified layout of the SRAM of FIG. 1A/1B.

FIG. 4 illustrates a simplified layout of the SRAM 100 showing three metal lines associated with Vm, BL and BLB that are disposed in parallel. A required parasitic couple capacitance Cbv may be obtained, for example, by adjusting the distance d between the lines of Vm and BL/BLB. A specific parasitic bit line capacitance may be obtained by adjusting a width w of the one line of the bit line pair. A specific boosting ratio may be obtained according to the specific parasitic bit line capacitance and the specific parasitic couple capacitance. And a specific voltage drop of the one line of the bit line pair may be obtained according to the specific boosting ratio in response to the change of the first power supply voltage from the first period to the specific period. In another embodiment, it may use multiple metal layers of BL/BLB and/or Vm to obtain a required parasitic couple capacitance Cbv.

Although specific embodiments have been illustrated and described, it will be appreciated by those skilled in the art that various modifications may be made without departing from the scope of the present invention, which is intended to be limited solely by the appended claims.

What is claimed is:

1. A static random access memory (SRAM), comprising:
   a voltage generator coupled to receive a positive power supply voltage, and to controllably generate a first power supply voltage, wherein the first power supply voltage has a substantially same voltage as the positive power supply voltage during a first period of a write operation, and the first power supply voltage has a reduced level that is lower than the positive power supply voltage and is higher than a retention voltage during a second period of the same write operation subsequent to the first period;
   a first inverter connected between the first power supply voltage and a second power supply voltage; and
   a second inverter connected between the first power supply voltage and the second power supply voltage;
   wherein the first inverter and the second inverter are cross-coupled, and the output nodes of the first inverter and the second inverter act as a bit node pair.

2. The SRAM of claim 1, wherein the first inverter and second inverter each comprises a pull-down transistor and a pull-up transistor connected in series between the first power supply voltage and the second power supply voltage.

3. The SRAM of claim 1, further comprising:
   a first access transistor connected between an output node of the first inverter and one line of a bit line pair and controlled according to a word line voltage; and
   a second access transistor connected between an output node of the second inverter and the other line of the bit line pair and controlled according to the word line voltage;
   wherein when the word line voltage is active, the voltage generator generates the first power supply voltage with substantially the same voltage as the positive power supply voltage during the first period and generates the first power supply voltage with the reduced level during the second period.

4. The SRAM of claim 3, wherein a voltage of the one line of the bit line pair drops according to a parasitic bit line capacitance of one line of the bit line pair and a parasitic couple capacitance between a line of the first power supply voltage and the one line of the bit line pair, in response to the change of the first power supply voltage from the first period to the second period.

5. The SRAM of claim 3, wherein a boosting ratio is defined by Cbv/(Cb+Cbv), where Cb represents a parasitic bit line capacitance of one line of the bit line pair and Cbv represents a parasitic couple capacitance between a line of the first power supply voltage and the one line of the bit line pair, and wherein in response to the change of the first power supply voltage from the first period to the second period, a voltage of the one line of the bit line pair drops according to the boosting ratio.

6. The SRAM of claim 5, wherein the one line of the bit line pair has an adjusted width associated with a specific parasitic bit line capacitance.

7. The SRAM of claim 6, wherein between the line of the first power supply voltage and the one line of the bit line pair has an adjusted distance associated with a specific parasitic couple capacitance.

8. The SRAM of claim 7, wherein a specific boosting ratio is obtained according to the specific parasitic bit line capacitance and the specific parasitic couple capacitance, and a specific voltage drop of the one line of the bit line pair is obtained according to the specific boosting ratio in response to the change of the first power supply voltage from the first period to the second period.

9. A method of operating a static random access memory (SRAM), comprising:
   asserting a word line;
   discharging one node of a bit node pair of the SRAM through one line of a bit line pair;
   generating a first power supply voltage for the SRAM with a substantially same voltage as a positive power supply voltage during a first period of a write operation, and with a reduced level that is less than the positive power supply voltage during a second period of the same write operation subsequent to the first period; and
   inducing a negative bit line voltage on the one line of the bit line pair owing to a parasitic couple capacitance between a line of the first power supply voltage and the one line of the bit line pair.

10. The method of claim 9, wherein the first power supply voltage with the reduced level is generated after voltage levels of the bit node pair cross.

11. The method of claim 9, wherein the reduced level is higher than a retention voltage required to retain bit information of the SRAM.

12. The method of claim 9, further comprising a step of resuming the first power supply voltage from the reduced level to the positive power supply voltage.

13. The method of claim 12, wherein the first power supply voltage is resumed after one node of the bit node pair substantially returns to ground level from a negative level.

14. The method of claim 12, wherein the first power supply voltage is resumed before the word line de-asserts.

15. The method of claim 9, wherein the negative bit line voltage is induced according to a parasitic bit line capacitance of one line of the bit line pair and the parasitic couple capacitance, in response to the change of the first power supply voltage to the reduced level.

16. The method of claim 9, wherein a boosting ratio is defined by Cbv/(Cb+Cbv), where Cb represents a parasitic bit line capacitance of one line of the bit line pair and Cbv represents the parasitic couple capacitance, and wherein in response to the change of the first power supply voltage to the reduced level, the negative bit line voltage is induced according to the boosting ratio.

17. The method of claim 16, further comprising a step of adjusting a width of the one line of the bit line pair to obtain a specific parasitic bit line capacitance.

18. The method of claim 16, further comprising a step of adjusting a distance between the line of the first power supply voltage and the one line of the bit line pair to obtain a specific parasitic couple capacitance.

* * * * *